United States Patent [19]

Rankin et al.

[11] 4,365,192

[45] Dec. 21, 1982

[54] ISOTOPIC BROAD-BAND SURVEY METER

[75] Inventors: William J. Rankin, Edina; Jerome P. Whitaker, Hopkins, both of Minn.

[73] Assignee: Holaday Industries, Inc., Edina, Minn.

[21] Appl. No.: 181,826

[22] Filed: Aug. 27, 1980

[51] Int. Cl.³ .............................................. G01N 31/02
[52] U.S. Cl. .................................. 324/72; 324/140 R
[58] Field of Search ............ 324/72, 72.5, 457, 140 R

[56] References Cited

U.S. PATENT DOCUMENTS

| | | | |
|---|---|---|---|
| 3,662,260 | 5/1972 | Thomas | 324/72 |
| 3,750,017 | 7/1973 | Bowman | 324/72 |
| 3,889,185 | 6/1975 | Wojtasinski | 324/72 |
| 4,023,408 | 5/1977 | Ryan | 324/72 |

Primary Examiner—Michael J. Tokar
Attorney, Agent, or Firm—Schroeder, Siegfried, Vidas, Steffey & Arrett

[57] ABSTRACT

A monitor for measuring the field strength of RF radiation is disclosed. A set of three mutually orthogonal antennas sense the total field strength. Digital linearizing and scaling circuits provide an output equal to the sum of the square of the field components. In the preferred embodiment, the digital circuitry includes a control or zero channel which provides a zero level control signal which is processed to provide a correction signal to the analog to digital conversion circuitry to remove the effects of noise, pickup and drift on both the transmission line, which connects the antenna and the monitor, and on the analog electronic circuits of the monitor.

10 Claims, 13 Drawing Figures

ISOTOPIC BROAD-BAND SURVEY METER

BACKGROUND OF THE INVENTION

I. Field of the Invention

This invention relates to an electronic measuring device and, in particular, to a measuring device for monitoring the field intensity of complex electromagnetic fields.

II. Description of the Prior Art

Electromagnetic measuring devices such as that described in U.S. Pat. No. 3,750,017 to Ronald Bauman and assigned to the United States of America are known for providing monitoring circuits for measuring electromagnetic fields. Such a monitoring circuit utilizes an analog nonlinear summing amplifier to linearize the voltage detected by Schottky barrier diodes connected to the three, orthogonal antennas. The circuitry does not provide a memory for peak readings detected and has no provision for continuous zeroing of the circuitry to correct for zero offset introduced by slow warm-up of electronic components and pickup of stray signals on the probe cable between the antenna and the meter.

SUMMARY OF THE INVENTION

It is therefore an object of this invention to provide a survey meter for accurately detecting the strength of complex electromagnetic fields. It is a further object of this invention to provide a survey meter employing an internal digital memory to capture the highest reading observed for display when desired.

It is a still further object of this invention to provide a survey meter which includes a provision for automatic full-time zeroing of the meter to eliminate the effects of offset, noise, pickup and drift while measurements are being performed.

In accordance with these and other objects of the invention, there is provided a broad-band survey meter comprising an isotropic antenna probe with three, orthogonally arranged antennas and detectors therein. As used herein, the probe may comprise antennas which may be dipoles connected to suitable diode detectors to sense electric field strength or may be suitable loop antennas and associated detectors to sense magnetic field strength. The probe is connected to the survey meter utilizing a probe cable which provides a control or zero channel aligned with the conductors for the three antenna channels. The meter circuitry also includes an additional identical, matched electronic preamplifier to process any input signal on the control channel in the same manner that the input signals from the three orthogonal antennas are treated. The circuitry digitizes the fourth or control channel output voltage and uses it to control the application of an offset correcting signal to the input of the internal analog to digital converter as the signals from each of the three antennas are digitized.

In a further aspect of this invention, the internal digital memory of the survey meter captures the highest reading observed for display on the meter when a peak read switch is depressed. Release of the peak read switch automatically clears and zeroes the peak hold memory.

These and other objects and advantages of the present invention will be more apparent by referring to the following detailed description and accompanying drawings.

DESCRIPTION OF THE PREFERRED EMBODIMENT

Figure 1:
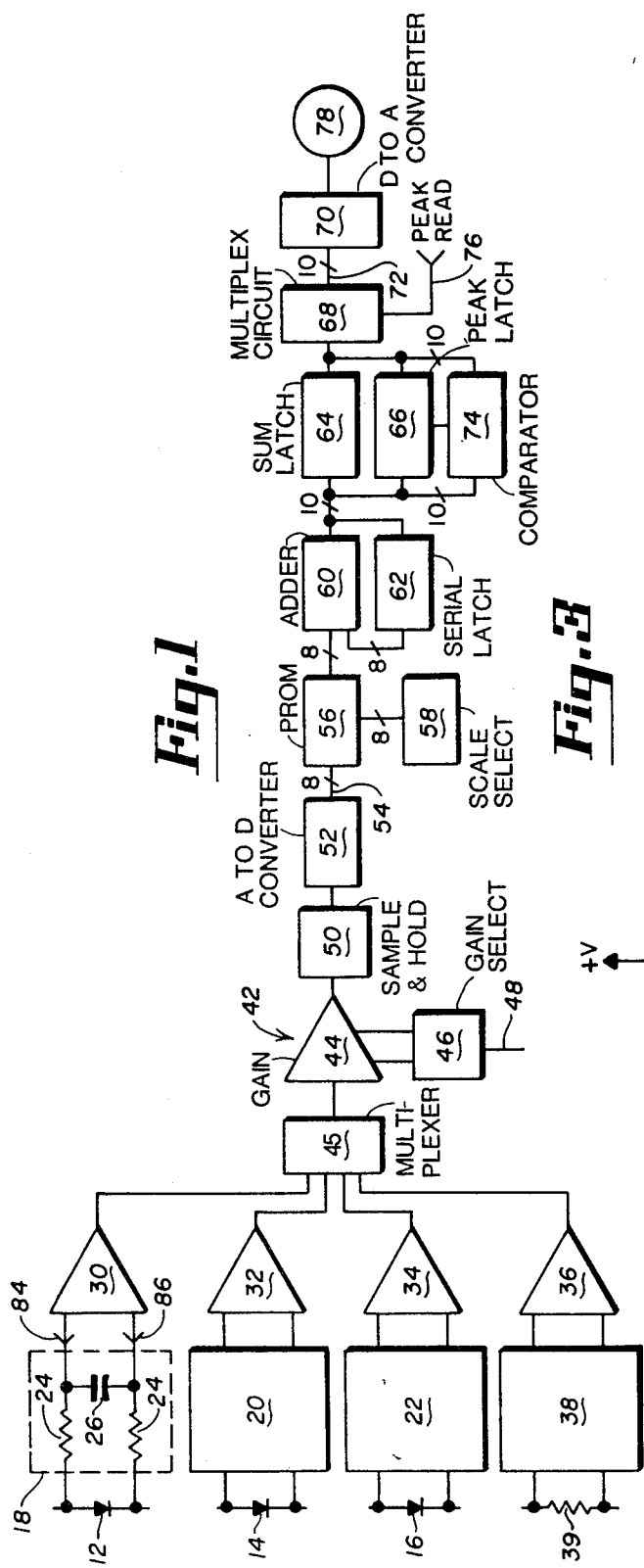
FIG. 1 is a block diagram of an RF radiation monitor incorporating the present invention.
Figure 5:
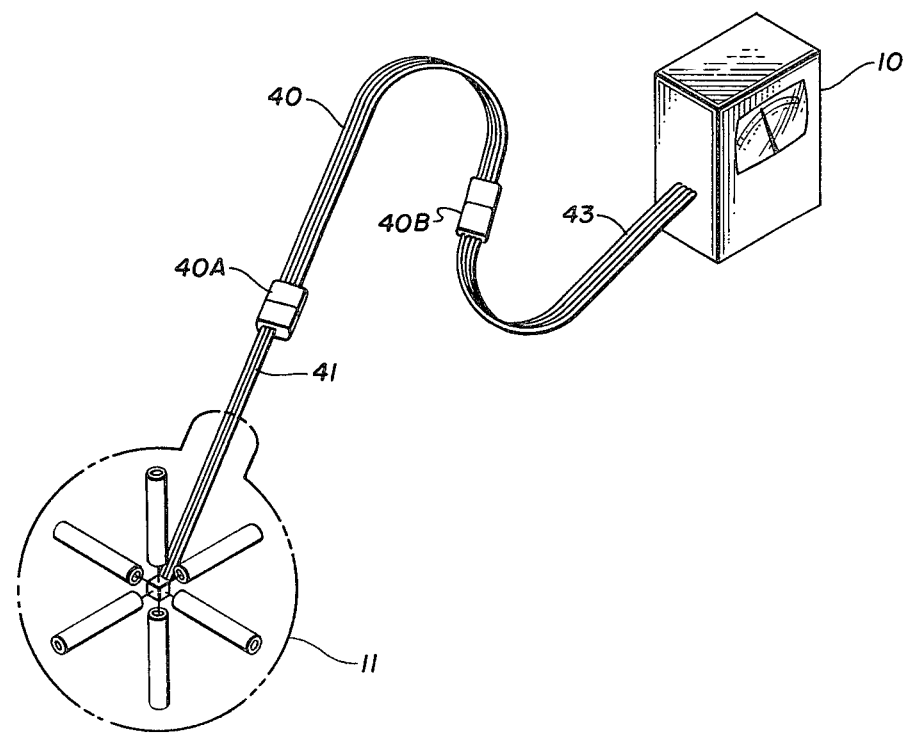
FIG. 5 is a diagram showing the antenna and the transmission lines used to connect the antenna to the monitor circuit.

Referring now to FIG. 1, the block diagram of the circuitry of the instrument is shown. An antenna 11, as shown in FIG. 5, produces three orthogonal output voltages from its three orthogonally aligned dipole antennas 11A, 11B and 11C. The three antenna signals which will be referred to as X, Y and Z herein are connected to low barrier Schottky diodes 12, 14 and 16 which act as detectors for the X, Y and Z axes, respectively.

In order to obtain an output indicative of the space power density of the detected electromagnetic radiation, it is necessary to square the detected components of each field segment and add them together to obtain a voltage representative of the effective space power density. Since the Schottky diodes 12, 14 and 16 have highly nonlinear characteristics, the relationship of the voltage across the diodes to the field applied to the antenna is extremely nonlinear. The circuitry shown uses digital circuitry to linearize the response of the meter.

In order to avoid interference by the meter with the field being measured, standard wire leads cannot be used to feed the signal from the detectors to the instrument package. A special high resistance transmission line 41 as disclosed in U.S. Pat. No. 3,750,017 is used. The conductors within the transmission line 41 are designated 18, 20 and 22 in FIG. 1. Shown within the dotted outline of conductor 18, the line resistance and distributed capacitance 24 and 26, respectively, are shown as lumped components. Similar characteristics also apply to conductor pairs 20 and 22 of 3-conductor transmission line 41.

The signals detected by antenna 11 and diodes 12, 14 and 16 are conducted down the high resistance conductor pairs 18, 20 and 22, respectively, of high resistance line 41. The high line resistance 24 and associated capacitance 26 make each transmission line a low pass filter equivalent which rectifies the detected signal and filters the RF to yield an output signal proportional to the received envelope.

The output signals at the end of conductor pairs 18, 20 and 22 of transmission line 41 are applied to the differential inputs of preamplifiers 30, 32 and 34 after passing through further transmission lines 40 and 43. A fourth preamplifier 36, which has its electrical and thermal characteristics matched to those of preamplifiers 30, 32 and 34, is connected to a further conductor pair 38 which is terminated in the vicinity of the antenna housing in an impedance similar to that of diodes 12, 14 and 16. Thus, all four conductor pairs 18, 20, 22 and 38 are subjected to almost identical stray field pickup and other signal distorting conditions.

FIG. 5 shows the configuration of the transmission lines 41, 40 and 43 connecting the meter and antenna 11. The additional conductor pair 38 is a part of a 4-conductor pair transmission line 40 which is a medium resistance line having a resistance of about 20,000 ohms per meter. In one embodiment, the medium resistance line has a length of about 18" and is terminated on both ends by connectors 40A and 40B.

Connector 40B is connected through about 5" of three conductor pair high resistance line 41 having an impedance of about 20,000 ohms per centimeter to antenna 11. Only the X, Y and Z signals from antenna 11 are present in transmission line 41. The termination resistor 39 for the redundant channel is located inside of connector 40A and connected to one of the four conductor pairs of transmission line 40.

Transmission line 40 is connected to a conventional 4-conductor pair transmission line 43 through connector 40B and hence to the inputs to amplifiers 30, 32, 34 and 36.

The additional channel 36 functions to provide an input signal to the monitor electronics equivalent to a "zero" received signal from antenna 11. The voltage present at the output of preamplifier 36 is therefore attributable only to offset, noise or AC pickup on the transmission line 38 or in the electronics. That voltage is representative of the offset in each of the three channels being monitored.

The output signals of amplifiers 30, 32, 34 and 36 are connected to the inputs of a multiplexer 40. Each of the four inputs is assigned a time slice in the operating cycle of the multiplexer which acts as a rotary switch to sample each of the four channels for a finite predetermined length of time.

The selected signal then is passed through the remaining circuits for further processing and the information from the three channels representative of the X, Y and z signals is recombined in the digital portion of the circuit before the analog output to the meter is obtained. The signal from the fourth or zero channel is used, as described below, to provide a continuing zero input reference signal and which is used to correct the output signal obtained from the other three channels prior to the signal being converted into digital form by the analog to digital converter.

The output signals from the multiplexer 40 are passed through an adjustable gain stage comprised in simplified block diagram form of a gain stage 44 controlled by a gain select circuit 46 which receives a range select input signal 48. The gain selecting circuitry to derive the range select signal at terminal 48 is described in more detail below in connection with FIGS. 2A–2I.

The output of the gain stage 44 is then connected to the input of a sample and hold circuit 50 which takes a small time slice sample of the incoming signal and holds that analog voltage at its output until the next sample is delivered from the multiplexer 40. The function of the sample and hold 50 is to insure that the signal delivered to the analog to digital conversion stage 52 following the sample and hold 50 is stable over the time interval which the analog to digital conversion stage 52 requires to form the digital equivalent of the signal.

The analog to digital stage 52 performs a successive approximation analog to digital conversion for the signal from each of the three orthogonal axes. As discussed in further detail below, the autozero circuitry, according to the present invention, functions by determining the magnitude and polarity of the residual voltage present on the fourth or zero channel and then corrects each of the digitized signals representative of the signals on each of the other channels.

Utilization of a redundant channel having no Schottky detection diodes or antenna, but including a separate conductor in the antenna meter transmission line, allows for correction of the signals received on the other three channels to eliminate interference imposed by 60 Hz pickup received on transmission lines 18, 20 and 22 because all four transmission lines run in parallel and are exposed to the substantially same noise fields. It will also be seen by a discussion of the circuitry below that the generation of the fourth signal from the zero channel allows the analog to digital conversion circuitry to be continually zeroed by adjustment of the reference voltage to minimize noise and drift of the overall circuitry and improve its accuracy.

The output of the A to D converter 52 is conducted on an eight line data bus 54 to a programmable read only memory or PROM 56. PROM 56 receives digital words from A to D converter 52 which correspond to the offset corrected, digitized received voltage signals from the three orthogonal axes of antenna 11. Because the characteristics of the Schottky diodes 12, 14 and 16 used in the detector are not linear, PROM 56 is used to linearize the voltages across the diode detectors into digital numbers indicative of the received field strength. In other words, PROM 56 is loaded with sufficient information to give output numbers equivalent to the square of the field strength according to the diode curves in response to input digital data defining the corrected digitalized voltage across the detector diode. The PROM output corresponds to the square of the received field strength for each of the three fields X, Y and Z. The output of fourth channel amplifier 36 is not applied as an input to PROM 56. The scale select circuit 58 selects the proper portion of PROM 56 to provide the linearized output indicative of the square of the detected field.

The three digital words coming out the PROM which represent the square of the field along each of the three detection axes are then summed by adder 60 and its associated serial latch 62. Thus, the X component passes through adder 60 and is temporarily stored in latch 62. The Y component is then placed in adder 60 and the X component stored in latch 62 is added thereto and the result is then returned to latch 62 to be summed with the Z component when it is placed in adder 60.

The resultant output of the adder 60 which is equal to the sum of the squares of the detected fields is then passed to both a sum latch 64 and a peak latch 66. The sum latch 64 stores the most recent sum from the adder 60 and delivers it to multiplexer 68 for delivery to digital to analog converter 70 through 10-conductor data bus 72.

In the event that the user desires to read the peak field strength detected, the peak latch 66 is utilized. That latch stores the peak reading detected in the interval subsequent to the read-out of previous peak reading. Comparator 74, which forms part of the peak latch circuitry, compares the sum stored in the peak latch 66 with the most recent sum in the sum latch 64 and replaces the sum in the peak latch 66 with the more recent sum when that sum is larger than the stored sum in the peak latch 66. In other words, latch 64 will always contain the most recent sum from adder 60 while latch 66 will always contain the largest sum from latch 60. The most recent sum or the largest sum are selected respectively by multiplex circuit 68 which is switched to transmit either the sum or peak latch result based on the setting of the peak read switch 76. The digital signal from multiplex circuit 68 is converted by the digital to analog converter 70 to provide an analog signal for driving the meter 78 which is mounted on the face of the monitor housing.

Figure 2:
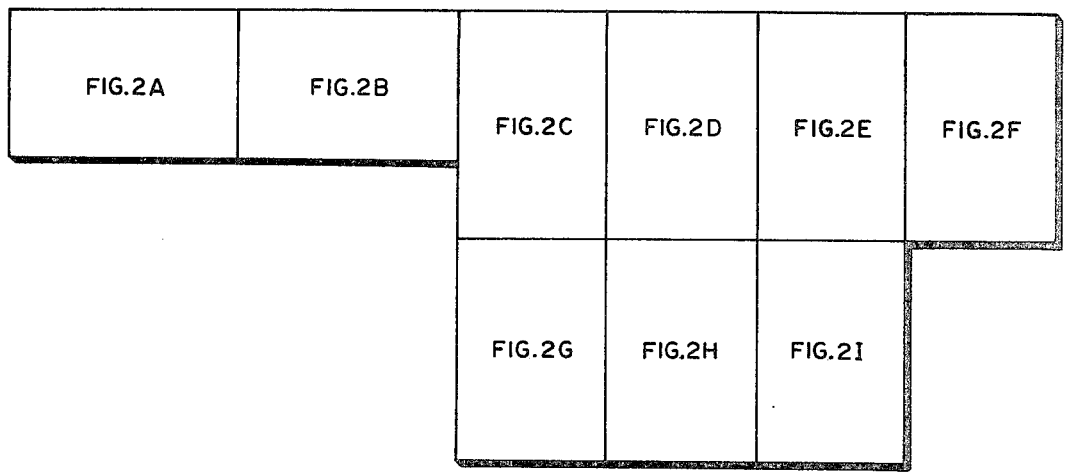
FIG. 2 is a plan showing the arrangement of FIGS. 2A through 2I, the detailed schematic of the monitor electronic circuits.

FIG. 2 shows the layout of FIGS. 2A–2I which are the detailed schematic of the circuitry of the monitor instrument. Amplifier 30 is shown in detailed schematic form in FIG. 2A, while amplifiers 32, 34 and 36 which contain identical components, are shown block diagram form only in order to simplify the drawings. The input terminals 84 and 86 of amplifier 30 are connected to the appropriate conductor pair of transmission line 43, medium resistance line 40 and high resistance line 41 and antenna 11 as shown in FIG. 5. The signal from X field sensor diode 12 is thus applied to terminals 84 and 86 and passes through resistors 88 and 90 to the inverting and noninverting inputs respectively of U1. Resistors 88, 90, 92 and 98; capacitors 94, 96 and 102; and operational amplifier 41 work together to form a balanced differential amplifier with capacitor 102 used to maximize the common mode rejection of the amplifier, while variable resistor 100 connected between pins 1 and 5 of U1 forms a balance circuit when its wiper is connected to the positive voltage supply. The circuitry within blocks 32, 34 and 36 corresponds to the circuitry within block 30.

Figure 4:
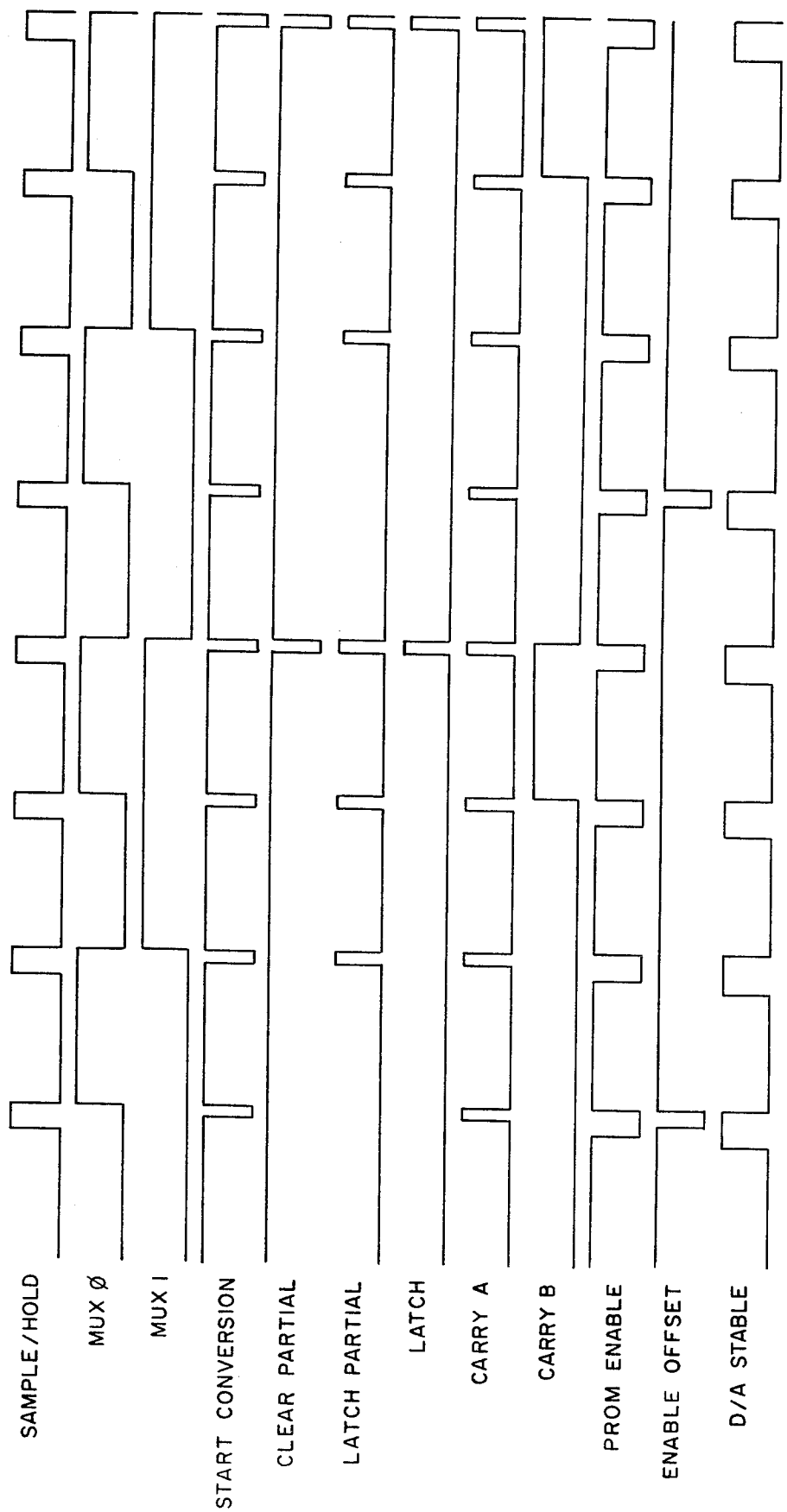
FIG. 4 is a diagram showing the time relationship of the logic signals used in the monitor.

The outputs of amplifiers 30, 32, 34 and 36 are connected to the input terminals of a switch U5 which receives MUX 0 and MUX 1 clock signals as shown in FIG. 4 from circuitry described in FIG. 2G and discussed below. The signals applied to pins 1 and 16 of the analog multiplexer chip U5 operate to sequentially select signals representative of the X, Y, Z or blank channels from the inputs at pins 4, 5, 6 and 7 of the chip. Those signals are sequentially switched to the output at terminal 8 of U5 and connected to provide an input at terminal 8 of U6.

Figure 3:
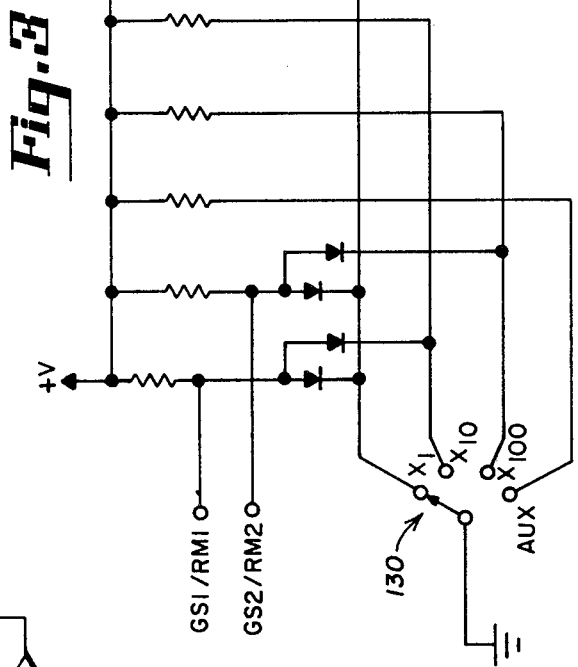
FIG. 3 is a schematic of a portion of the gain select circuitry of the monitor.

U6 is the multiplexer which provides the gain select portion of the circuitry, functioning in response to the GS1 and GS2 signal generated by the circuit in FIG. 3 applied to terminals 1 and 16 to switch the input from terminal 8 to one of the four output terminals at pins 4, 5, 6 or 7 which are connected through series resistors 104 through 111. The zero level signal from the terminal 9 of U5 is also switched to appropriate output terminals 10, 11, 12 or 13 of U6 and connected through an appropriate resistor 114 through 117 to balance the input impedance on both input terminals 2 and 3 of differential amplifier U9 shown in FIG. 2B. U9 has an input resistor 122 connected between the noninverting input at pin 3 and ground and a capacitor 123 connected in parallel with resistor 122 as shown in FIG. 2A. A feedback resistor 124 is connected between the output of U9 and its inverting input and a capacitor 125 is connected in parallel with feedback resistor 124.

The circuit for generating the GS1 and GS2 logic signals for pins 1 and 16 of the U6 multiplexer in FIG. 2A is shown in FIG. 3. In FIG. 3, a gain selector switch 130 is used to select between four possible scales. By the simple diode logic circuits as shown in FIG. 3, GS1 and GS2 are respectively 0,0; 0,1; 1,0; and 1,1 for the X1, X10, X100 and AUX settings of switch 130 respectively. The circuit also generates signals RM1 and RM2 which are used to select the proper scale in the read only memory as shown in FIG. 2C and as discussed below.

The output from U9 is connected through a sample and hold switch 132 to a storage capacitor 134 which stores the analog input to the analog to digital converter which is comprised of microelectronic circuits U12 through U15. U13 is a digital to analog converter circuit and U15 is a successive approximation register. U15 operates one bit at a time to approximate the digital number corresponding to the analog signal stored on the holding capacitor 134. The circuit of U15 operates one bit at a time starting with the most significant bit. The reference voltage to determine the scale factor of the analog to digital converter is applied to pin 15 of U13.

U12 is the buffer amplifier used with the U13 digital to analog converter. U11 delivers an autozero signal to the analog to buffer amplifier U12 by using the signal from the fourth or redundant channel to generate a DC offset signal to correct the digital to analog converter input and eliminate the effects of pickup and noise from the indication of the received field strength. The operation of that circuitry is discussed in more detail below.

Figure 2H:
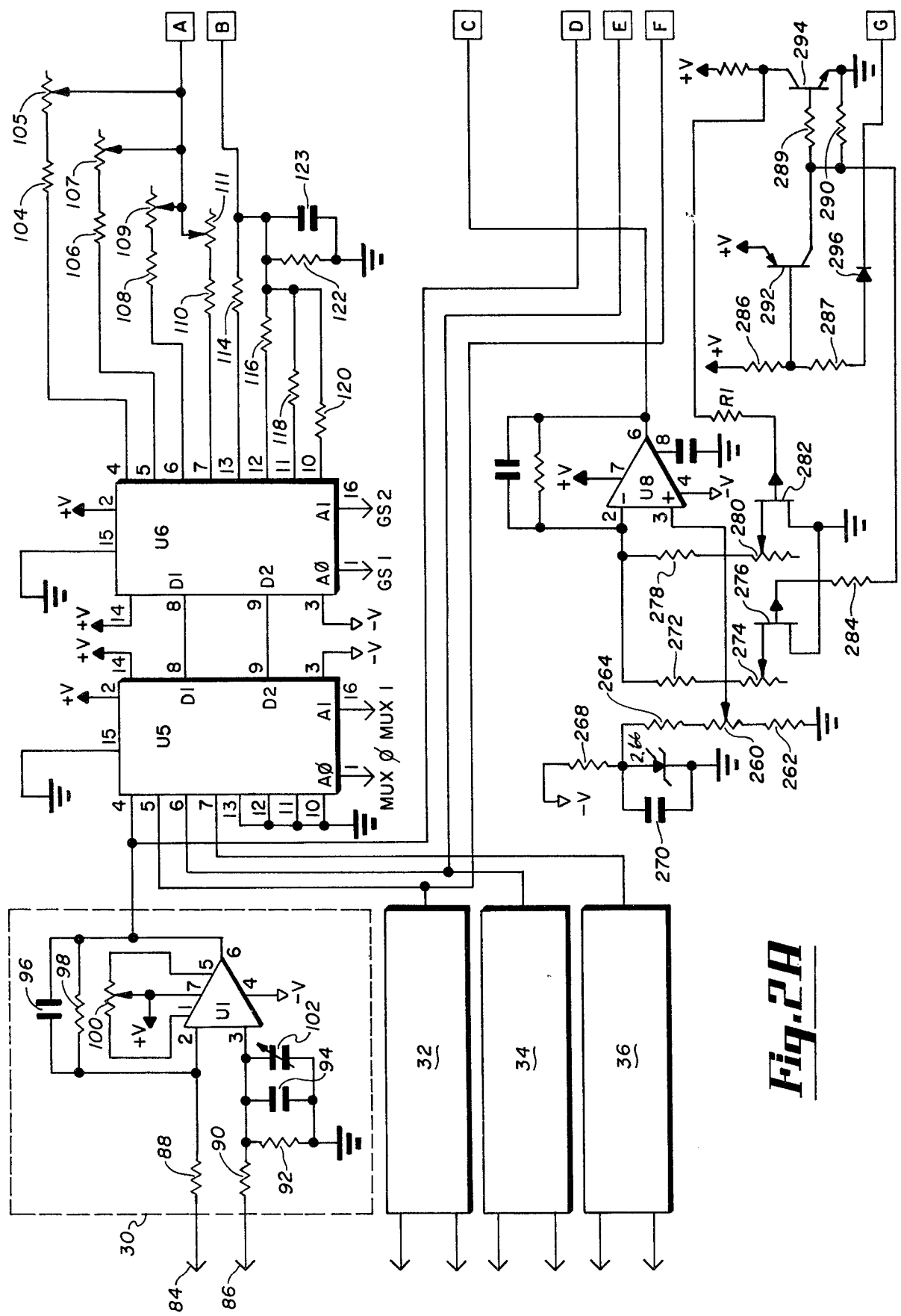
Figure 2B:
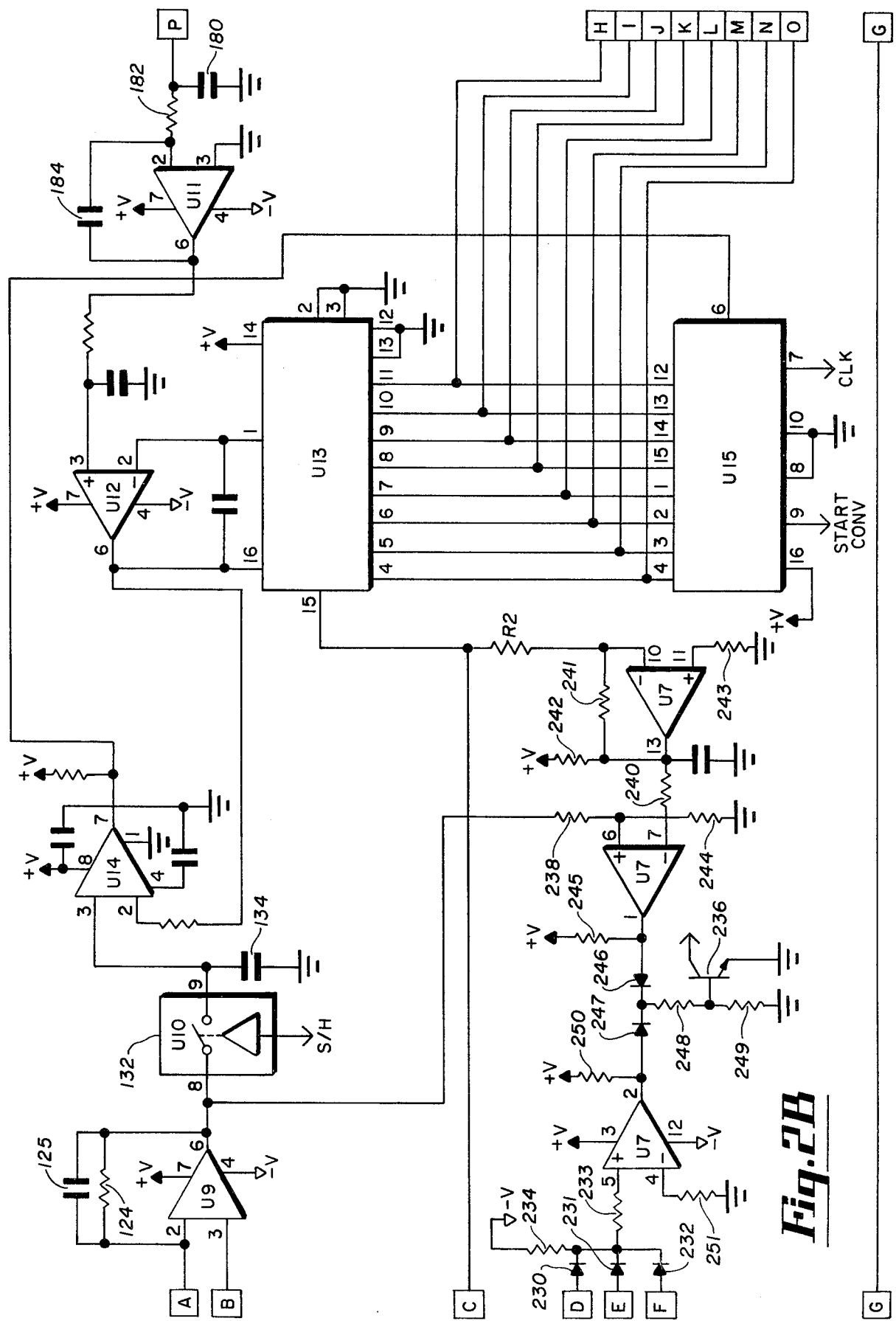
Figure 2C:
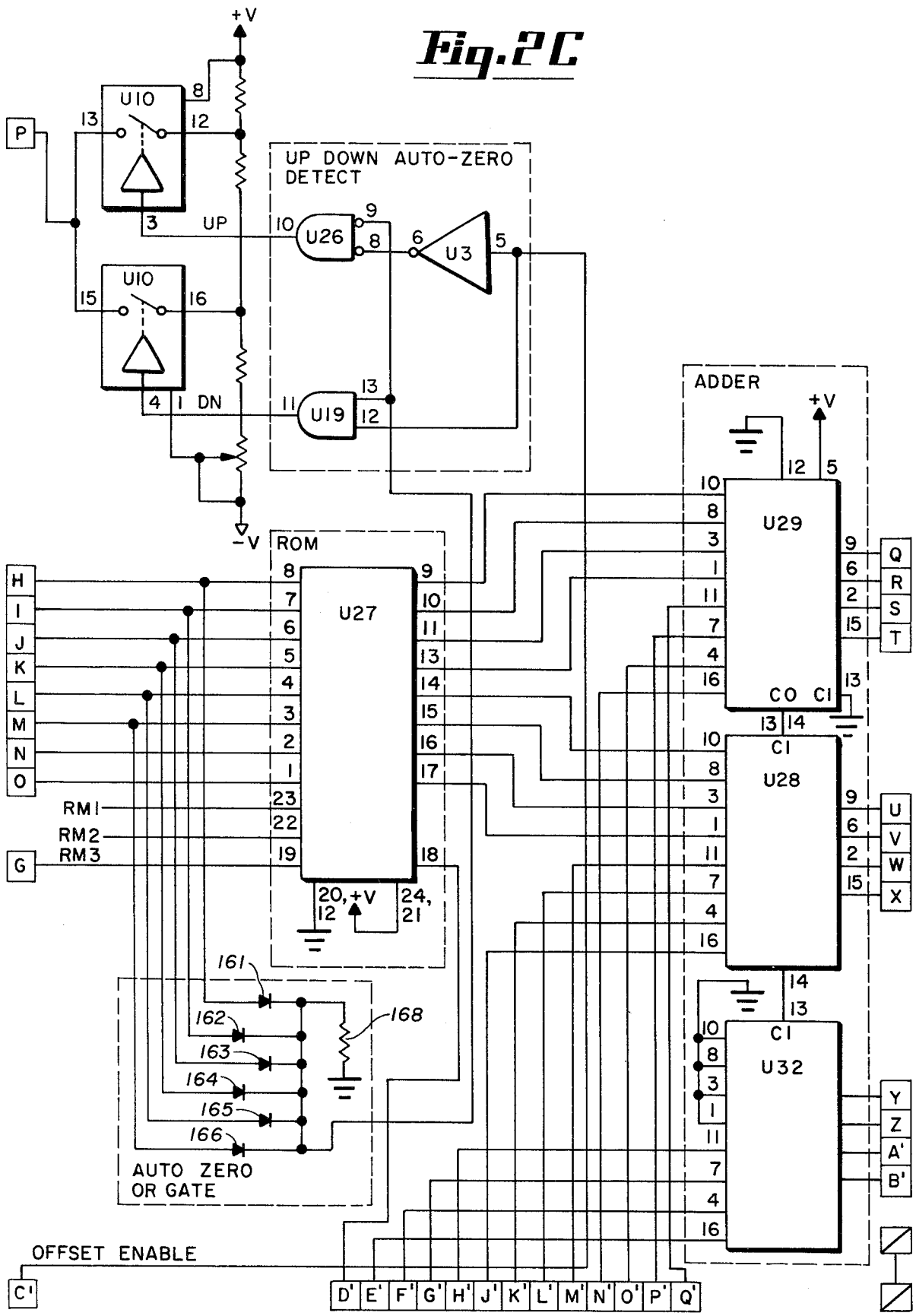
Figure 20:
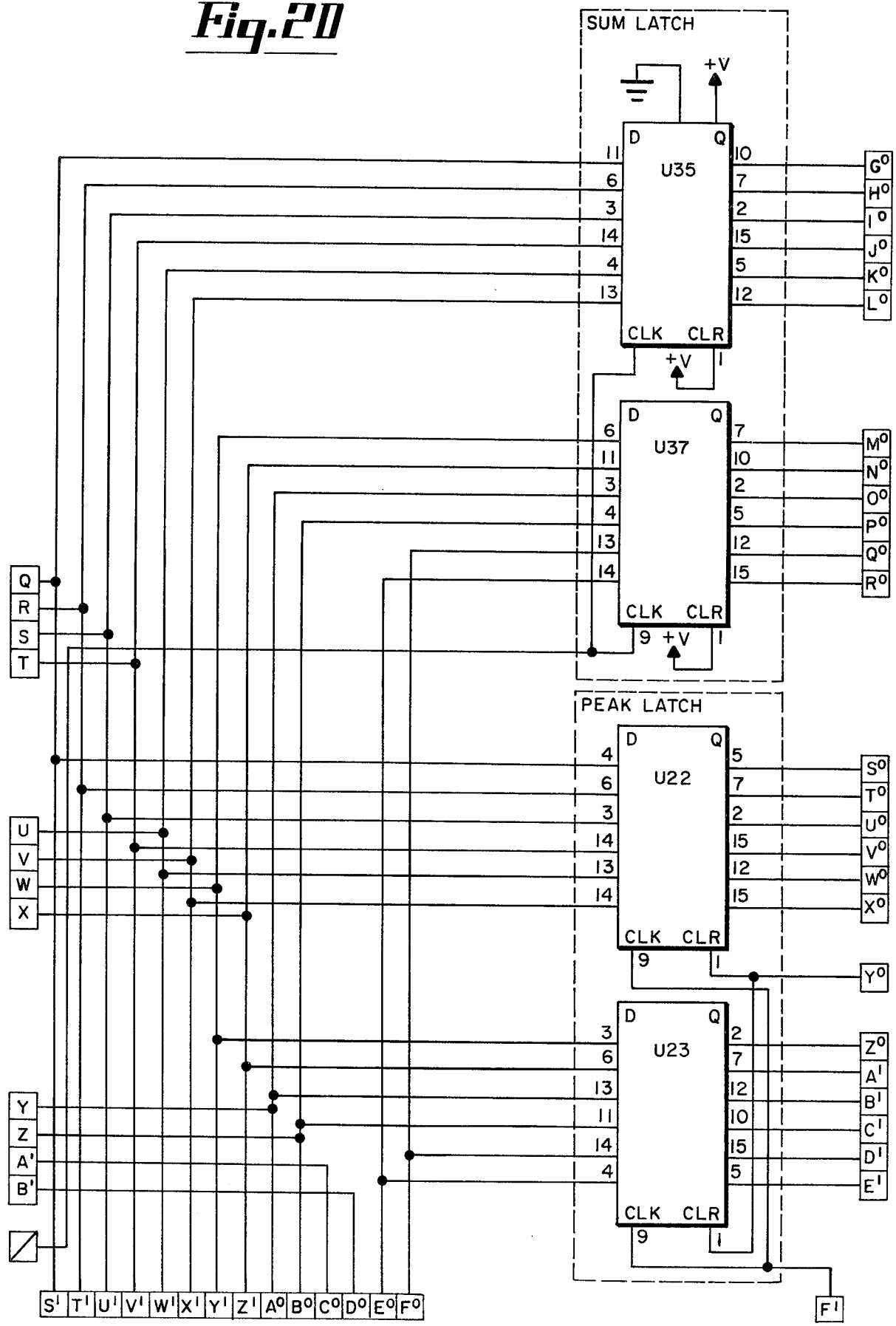

The output of the analog to digital converter is taken on the eight conductor data bus and connected to the input of U27 in FIG. 2C which is a 2048 by 8 bit PROM memory. The range of the PROM is determined by the inputs RM1 and RM2 generated by the circuitry of FIG. 3 and an RM3 signal which may be generated by an interlock in the antenna 11 or its associated transmission line to permit usage of an antenna head having different sensitivity. As stated, when the RM3 line to U27 pin 19 is grounded, the gain change is communicated to the PROM and the reference voltage for the A to D converter is changed by the circuitry of FIG. 2A discussed below. The RM3 signal indicates whether or not the high sensitivity or the low sensitivity antenna probe is connected to the circuit while the RM1 and RM2 functions are dependent upon the gain setting selected by gain switch 130 as shown in FIG. 3.

As indicated above in connection with the simplified block diagram of FIG. 1, the PROM U27 provides an eight bit digital output which linearizes the input signal according to the diode characteristics of the detector so that the output is indicative of the square of the field strength detected at the antenna.

The least significant six bits of the output of the analog to digital converter are ORed by diodes 161 through 166 and the resulting signal across resistor 168 is connected to pin 13 of U19 and pin 9 of U26. As shown, U19 is a positive AND circuit while U26 is a negative input AND circuit. The AND circuits U19 and U26 AND the output of the autozero OR gate with a timing signal which is present when the fourth or zero channel has its digital representation being generated by the A to D converter. The timing signal is generated by the circuit in FIG. 2G and is the ENABLE OFFSET signal shown in FIG. 4. The signal at 168 indicates that there is a non-zero digital output of the analog to digital converter U13 during the time slice assigned to the fourth or zero channel.

When the ENABLE OFFSET timing signal is ANDed with the signal at 168, indicating that there is a non-zero digital output during the redundant channel time slot, either an UP or a DOWN signal is provided at the output of U26 or U19 depending upon whether a zero or a one is present across resistor 168. If a non-zero signal is coming out of the successive approximation register U15, a DOWN pulse is produced to reduce the magnitude of the autozero correction to capacitor 180. If a zero is produced at the output of the analog to digital converter U13, the circuitry will produce an UP signal.

The UP and DOWN signals from U26 and U19 are provided respectively to drive the appropriate one of the switches U10 at terminal 3 or terminal 4. The U10 terminal 3 switch switches a positive current pulse to increase the charge on capacitor 180 shown in FIG. 2B to a more positive voltage. The switch driven by pin 4 of U10 drives a negative current pulse to discharge capacitor 180. The corrective pulses are supplied during the ENABLE OFFSET time interval.

The voltage across capacitor 180 is connected through resistor 182 to the input of U11 which has a capacitor 184 connected between its output and inverting input to smooth the signal received from capacitor 180. That smoothed signal is the input signal to pin 3 of the buffer amplifier U12. As can be seen from the above description, the signal from U11 is the autozero corrective signal and is adjusted once each operating cycle as the redundant channel output is sampled. The autozero corrective signal adjusts the analog input signal to the analog to digital converter input to compensate for offset, noise and pickup introduced by the transmission lines connecting the monitor and antenna and by the preamplified electronics.

Returning now to the memory U27, it can be seen that the output of U27 is connected to U28 and U29 which, with U32, form the adder to sum the square of X, Y and Z field components as those digital numbers are successively delivered at the output of U27. As explained with respect to FIG. 1, after the first sum appears at the adder output of U29, U28 and U32, that number is latched into U30 and U31, shown in FIG. 2G, to be summed with the Y component. The X and Y intermediate sum is then stored in U30 and U31 for addition to the Z component. The final sum is then delivered to U35 and U37, the sum latch shown in FIG. 2D, which always contains the most recent sum of the squares of the field components.

Figure 2E:
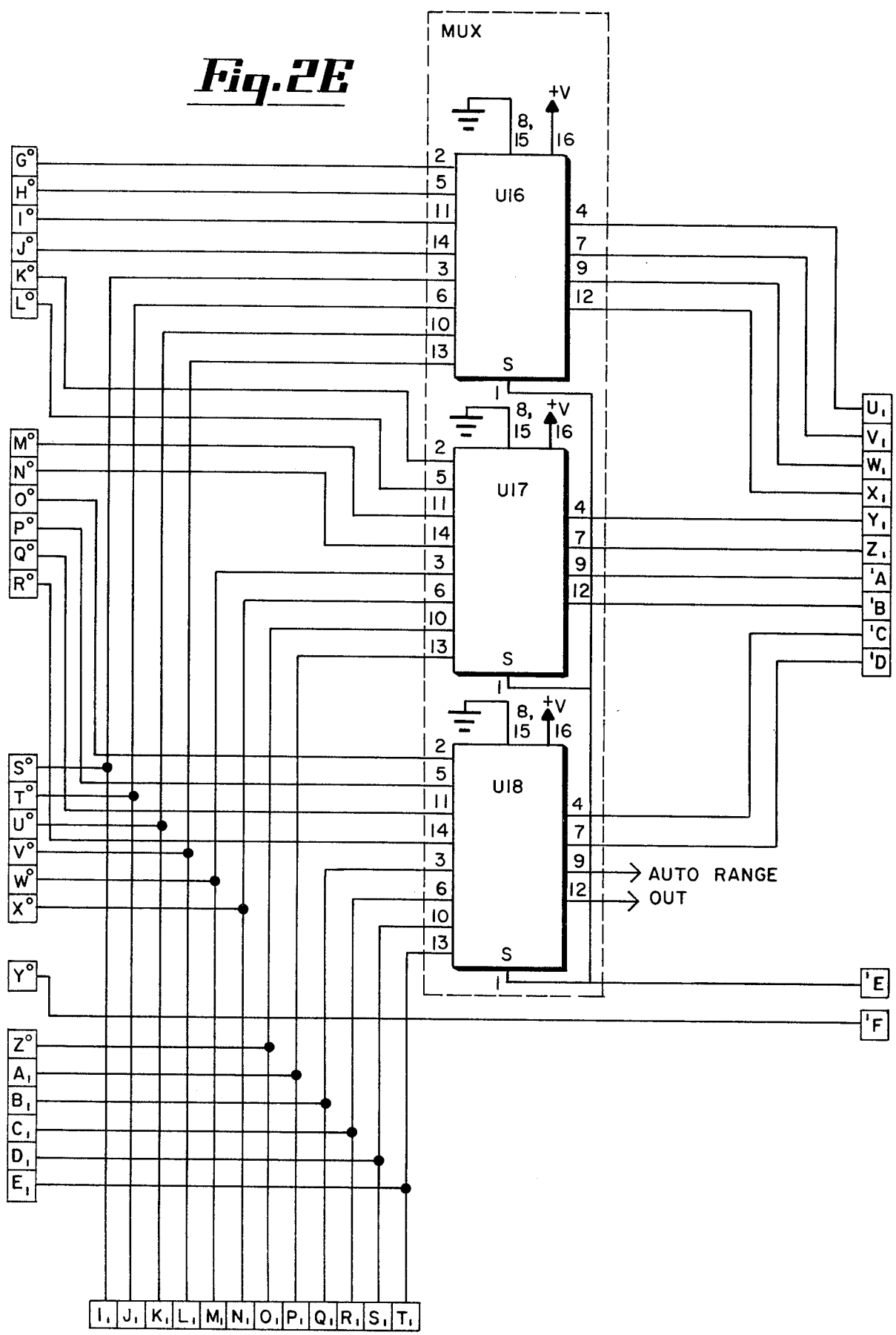
Figure 2F:
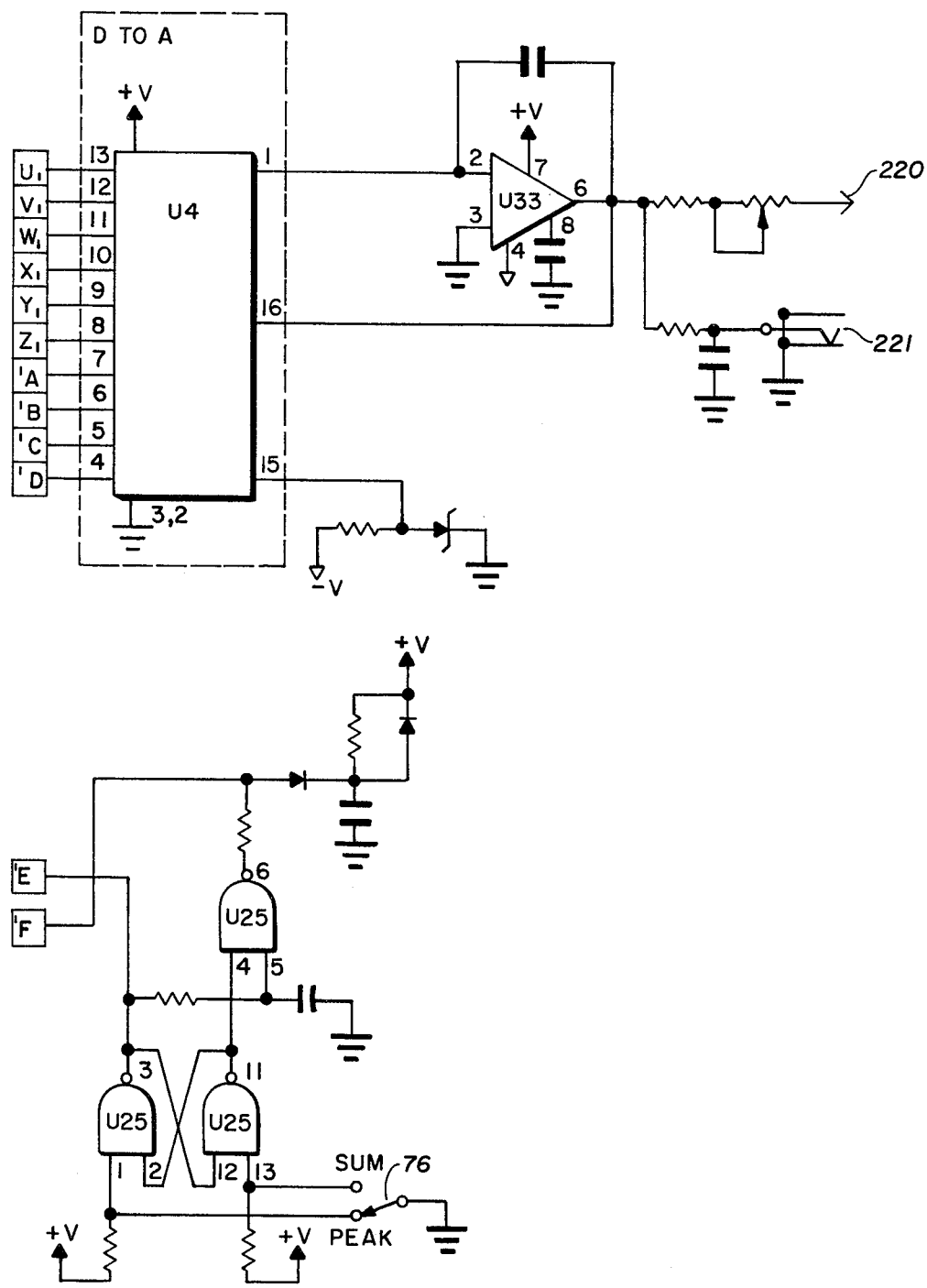

The output of the sum latch comprised of U35 and U37 is connected to the multiplex switch circuit comprised of elements U16, U17 and U18, shown in FIG. 2E, which receive a further input from the peak latch comprised of U22 and U23. The peak latch at the beginning of the operation of the circuit stores the initial sum determined by the adder. Each time a new sum is determined, the contents of the peak latch are compared to the new sum and where the new sum exceeds the number stored in peak latch, that sum is then loaded into the peak latch circuit. The output multiplexer normally delivers an output from the sum latch circuit until switch 76, shown in FIG. 2F, is switched from sum to peak to cause the output multiplexer U16, U17 and U18 to switch its output to the output of the peak latch rather than the output of the sum latch. When the peak switch 76 is returned to the normal position, the peak latch is cleared to zero and then resumes operation by storing the peak readings generated by the adder until it is read out again.

The outputs of U16, U17 and U18 are delivered through the ten-conductor bus to the digital to analog converter U4 which provides at terminal 1 an analog output signal which is smoothed by amplifier U33 and used to drive a meter circuit at output terminal 220. A separate jack 221 can be used as an auxiliary output when connected to drive an auxiliary meter. It is also possible to generate an audio output by converting the output of U4 to drive a voltage-controlled oscillator in the audio range to provide the operator with an indication of high field strength areas without requiring him to watch a meter dial.

Figure 2G:
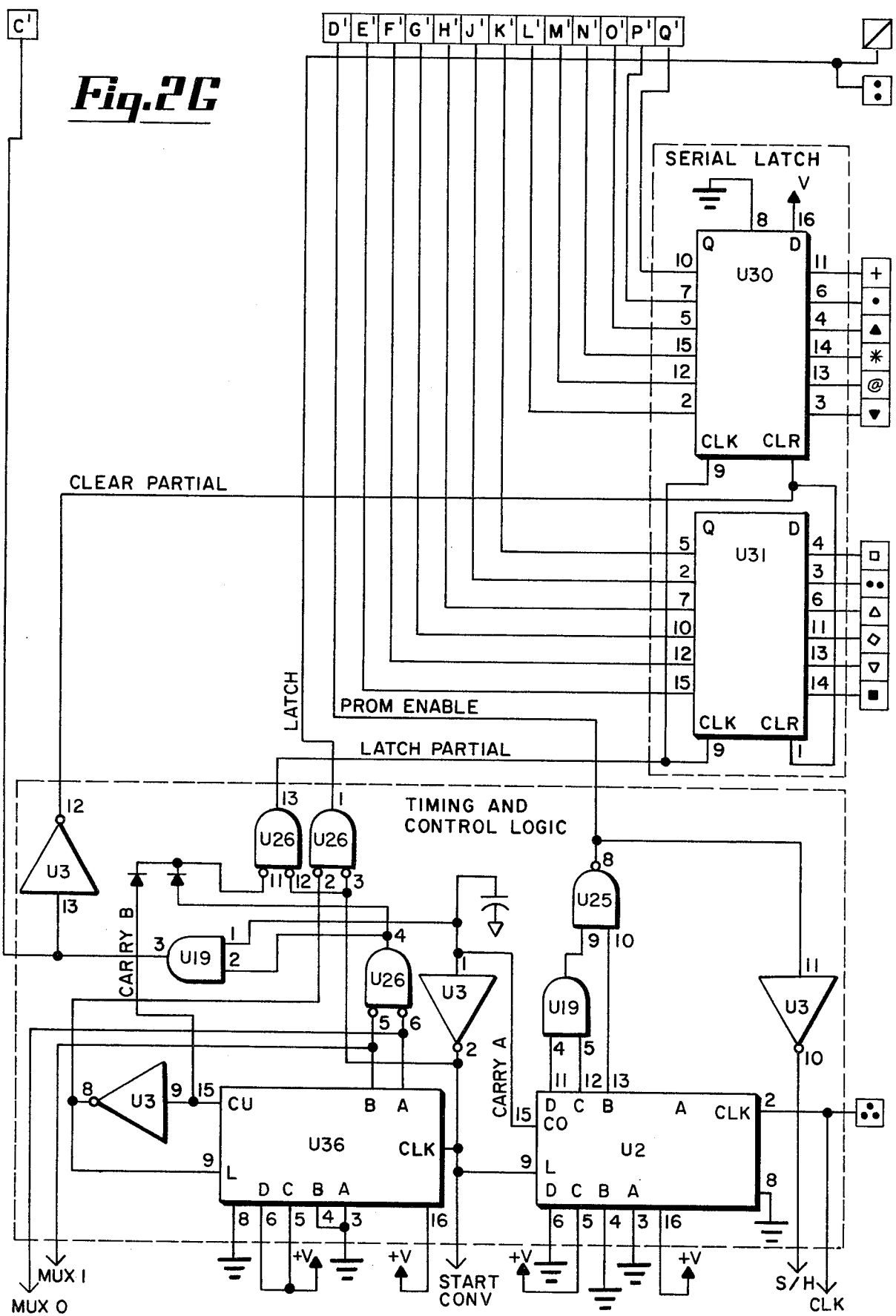
Figure 2H:
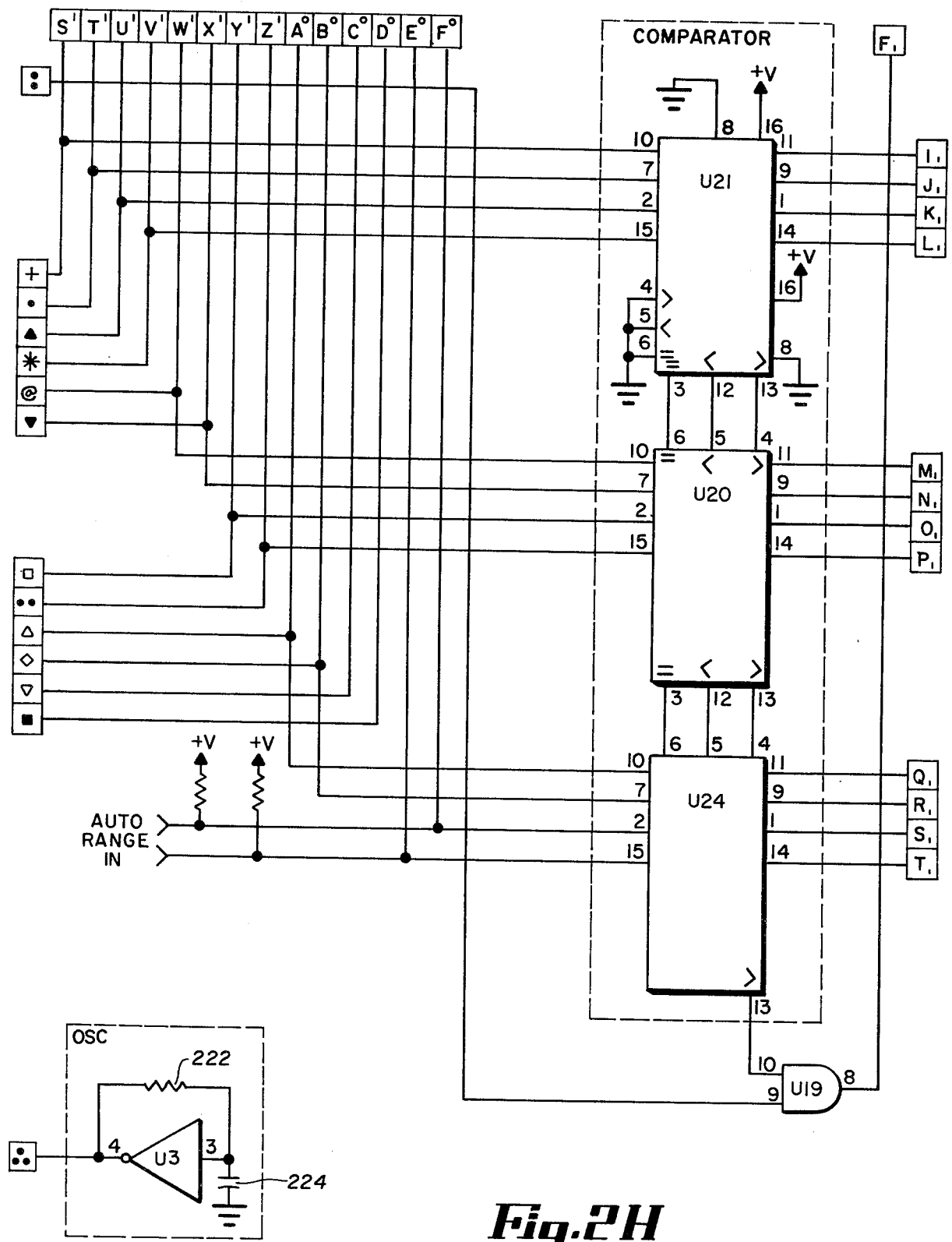
Figure 21:
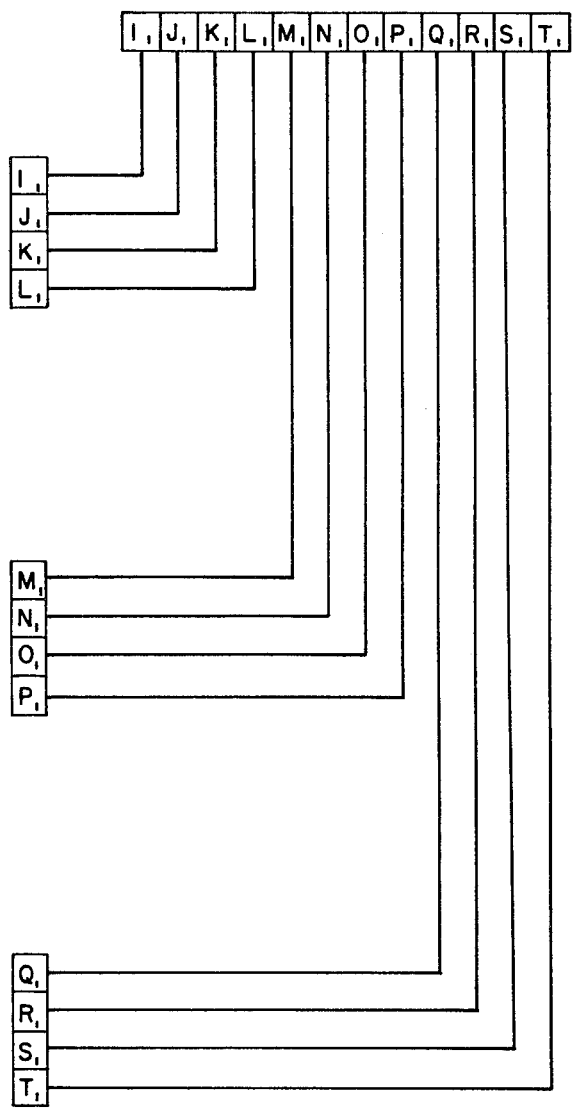

Also shown in FIG. 2G is the specific logic circuitry used to provide the logic and timing signals used by the memory, the latch circuits and the circuit for generating the autozero correction pulses for the A to D converter inputs.

The basic clock signal for the circuitry is generated by resistor 222 and capacitor 224 which are connected as the feedback resistor and input capacitor respectively of U3. The clock signal at the output of U3 at pin 4 is connected to the clock input of the successive approximation register U15. It also is used to drive the clock input of U2, a binary counter which generates the sequential MUX 0 and MUX 1 signals to cause the multiplexer U5 to select the X, Y, Z and redundant channel outputs in a sequential manner at an 8 KHz rate. The interrelationship of the logic output signals is shown in detail in FIG. 4 for a complete cycle of the system.

The circuitry used to generate an overrange signal is shown in FIG. 2B. If common mode input voltage to preamplifiers 30, 32 and 34 exceeds the limits of the preamplifiers, their outputs will try to drive to the positive supply voltage. This positive output is detected by the diode OR circuit comprised of diodes 230, 231 and 232, the output of which is applied through resistor 233 to the noninverting input of comparator U7, the inverting input is connected to ground through resistor 251 and the output is connected to the positive supply through resistor 250. If the noninverting input of comparator U7 goes positive, the output will also go positive, turning on transistor 236 through diode 247 and resistor 248. Transistor 236 provides a low resistance path from the collector to ground which can be used to turn any suitable overrange indicator on. The base of transistor 236 is connected to ground through resistor 249.

An additional point which may be monitored by the overrange circuit is the voltage at pin 6 of U9 at the input to the sample and hold. That signal is applied to pin 6 of U7 through resistor 238 and is compared to the voltage at pin 7 of U7 which is connected through resistor 240 to the output terminal 13 of a comparator U7, which is wired as an inverting buffer amplifier whose input pin 10 is the reference voltage of the analog to digital converter from pin 15 of U13. Pin 11 of U7 is grounded through resistor 243.

The reference voltage for the analog to digital converter stage is generated by the circuitry in FIG. 2A. Adjustable resistor 260 is part of a voltage divider formed of resistors 260, 262 and 264. A zener diode 266 and resistor 268 establish the controlled voltage across the divider while capacitor 270 stabilizes the voltage. The wiper on adjustable resistor 260 supplies a stable reference voltage to the noninverting input of amplifier U8. The other input to U8 is connected through resistors 272 and 274 and FET 276 to ground and also through resistors 278, 280 and FET 282 to ground. FET 282 has its gate connected to the collector of transistor 292 through resistor R, while FET 276 has its gate connected through resistor 284 to a circuit comprised of resistors 286 to 290, PNP transistor 292 and NPN transistor 294. Resistor 287 is connected to the RM3 input at pin 19 of memory U27 through diode 296. An interlock connected to pin 19 of U27 indicates whether a high or low gain antenna is being used and, by changing RM3, indicates to the memory which gain is being used. The RM3 signal also increases the reference voltage to the A to D converter when the low gain antenna is used to increase the accuracy by providing a more nearly full scale digital output.

The RM3 interlock which is used to indicate which antenna gain is being utilized drives a circuit which supplies a low resistance path from the cathode of diode 296 to ground at the RM3 input at pin 19 to memory U27 when the low gain antenna is used. There is then a low resistance path through resistor 287 to turn on transistors 292 and 294 and turn off FET 276 and turn on FET 282 to raise the reference voltage level supplied to the analog to digital converter.

As can be seen from the above description, the monitor circuit provides an easy-to-use instrument for providing field strength readings. The circuit is initially zeroed while the antenna is in a zero-field condition by enclosing antenna 11 in a metal shield and adjusting the zero adjustment 100 of each preamplifier 30, 32, 34 and 36.

After the monitor is zeroed and the shield removed, the gain for each channel is calibrated by adjusting resistors 103, 107, 109 or 111 for the various gain ranges.

In normal operation, the autozero applies a corrective pulse to alter the correction signal on capacitor 180, once each operating cycle to cancel the effects of offset, noise and pickup between the antenna and the measuring circuit.

The preferred embodiment shown was constructed with the standard circuit modules listed below:

IDENTIFICATION OF CIRCUIT MODULES

| Designation in Patent Spec | Manufacturers' Identification | Description |
|---|---|---|
| U1 | LF356 | JFET Input operational amplifier; National semiconductor |
| U2 | 74C163 | CMOS Binary counter; National |
| U3 | 74C14 | CMOS Hex Schmitt trigger; National |
| U4 | AD7520 | 10 bit binary multiplying D/A converter; National |
| U5 | 6208 | 4-channel differential analog multiplexer; Intersil |
| U6 | 6208 | 4-channel differential analog multiplexer; Intersil |
| U7 | LM339 | Quad voltage comparator; National |
| U8 | LM208 | Operational amplifier; National |
| U9 | LF356 | JFET Input operational amplifier; National semiconductor |
| U10 | AD7510 | CMOS Quad analog switch; Analog Devices |
| U11 | LF356 | JFET Input operational amplifier; National semiconductor |
| U12 | LM318 | Operational amplifier; National |
| U13 | AD7520JN | 10-bit binary multiplying D/A converter; National |
| U14 | LF311 | Voltage comparator |
| U15 | MC14549 | CMOS 8-bit sucussive approximation register; Motorola |
| U16 | 74C157 | CMOS Quad 2-input multiplexer; National |
| U17 | 74C157 | CMOS Quad 2-input multiplexer; National |

IDENTIFICATION OF CIRCUIT MODULES -continued

| Designation in Patent Spec | Manufacturers' Identification | Description |
|---|---|---|
| U18 | 74C157 | CMOS Quad 2-input multiplexer; National |
| U19 | 74C08 | CMOS Quad 2-input anogate; National |
| U20 | 74C85 | CMOS 4-bit magnitude comparator; National |
| U21 | 74C85 | CMOS 4-bit magnitude comparator; National |
| U22 | 74C174 | CMOS Hex D flip-flop; National |
| U23 | 74C174 | CMOS Hex D flip-flop; National |
| U24 | 74C85 | CMOS 4-bit magnitude comparator; National |
| U25 | 74C00 | CMOS Quad 2-input NAND gate; National |
| U26 | 74C02 | CMOS Quad 2-input NOR gate; National |
| U27 | 2716 | 16K UV erasable PROM; Intel |
| U28 | 74C83 | CMOS 4-bit binary full adder; National |
| U29 | 74C83 | CMOS 4-bit binary full adder; National |
| U30 | 74C174 | CMOS Hex D flip-flop; National |
| U31 | 74C174 | CMOS Hex D flip-flop; National |
| U32 | 74C83 | CMOS 4-bit binary full adder; National |
| U33 | LM208 | Operational amplifier; National |
| U35 | 74C174 | CMOS Hex D flip-flop; National |
| U36 | 74C163 | CMOS binary counter; National |
| U37 | 74C174 | CMOS Hex D flip-flop; National |

Although the preferred embodiment of the invention shows a meter and probe for measuring the electric field component of an electromagnetic field, it is possible to utilize the same invention to measure the magnetic field components. For example, a magnetic field sensing probe having loop antenna elements and suitable thermocouple or diode detectors can be readily substituted for the diode and dipole electric field detector probe. The remainder of the measuring circuit, including the control channel, can then be used to provide an output in terms of magnetic rather than electric field strength. The AUX channel of the scaling circuit can be calibrated to provide for magnetic field outputs when a magnetic field sensing probe is used rather than an electric field sensing probe.

It is also true that the invention can be used for measuring electric fields using a suitable dipole antenna and a detector other than a diode. For example, a probe using a dipole antenna and a thermocouple could also be used to measure electric field strength.

Other modifications and variations of the present inventiion are possible in light of the above teachings. It is therefore to be understood that, within the scope of the appended claims, the invention may be practiced otherwise than as specifically described.

What is claimed is:

1. A circuit for providing an output indicative of voltage signals applied to at least one input port, said circuit comprising:
    a control input port connected to receive a control voltage signal;
    first switching means connected to each of said input ports and said control input ports to sequentially connect voltage signals from one of said ports to an output terminal;
    conversion means connected to the output terminal of said switching means to receive signals therefrom and convert received signals to a digital representation;

an OR gate connected to receive the least significant output digits of said analog to digital conversion means and provide output signals representative of either a zero or non-zero output of said conversion means;

a gated detector connected to receive the output of said OR gate and providing a first command when the control voltage signal received at said control input port produces a non-zero digital signal at the output terminal of said conversion means and producing a second command when said conversion means produces a zero output;

second switching means connected to receive the commands provided by said detector means and provide a charging current of a first polarity when the output of said converter is non-zero and to provide a charging current of an opposite polarity when the output of said conversion means is zero; and correcting means connected to said second switching means to receive charging currents therefrom and produce an output voltage integrated from said charging currents and apply said voltage to the input to said analog to digital converter means to correct the output signal produced by said input ports in response to the control voltage at the control input port.

2. The invention of claim 1 wherein said input ports are connected to electromagnetic field sensors through a cable and wherein said control input port is connected to a terminating impedance through conductors enclosed in said cable and the control voltage is representative of the pickup received by said cable.

3. The invention of claim 2 wherein said terminating impedance has impedance characteristics similar to the impedance of said electromagnetic field sensors.

4. A monitor for providing an output indicative of the detected electromagnetic field at an antenna probe location remote from the circuitry of said monitor:

at least one conductor pair connected at one end to the circuitry of said monitor, each of said conductor pairs connected at the other end to an antenna and detector located in said antenna probe, each of said conductor pairs providing a voltage signal to the circuitry of said monitor indicative of the field strength at said antenna;

a further conductor pair connected at one end to said circuitry of said monitor and connected at the other end to an impedance similar to that of antennas and detectors in said antenna probe, said further conductor pair and first named conductor pairs comprising a single cable between said antenna probe and the circuitry of said monitor;

control means for selecting between the voltage signals applied to the circuitry of said monitor by said first named conductor pairs and said further conductor pair and providing the selected voltages to an output terminal and providing a gating signal when the voltage provided to said output terminal is from said further conductor pair;

analog to digital conversion means connected to receive at its input terminal an analog voltage signal from the output terminal of said control means, said analog to digital conversion means providing an output digital signal indicative of the analog input signal applied thereto;

detector means connected to receive the least significant digits of the output of said analog to digital conversion means and provide a first output when the output of said analog to digital conversion means is non-zero and to provide a second output when the output of said analog to digital conversion means is zero;

gating means connected to receive the output of said detector means and the gating signal from said control means, said gating means producing a first corrective pulse when the first signal from said detector means is received and producing a second corrective pulse when the second signal from the detector means is received; and error corrective means connected to said gating means for receiving said pulses therefrom and generating a corrective signal to be summed with the input to said analog to digital conversion means to adjust signals from said first recited conductor pairs applied to said analog to digital converter to correct the output of said analog to digital conversion means.

5. The invention of claim 4 wherein each of said detectors has nonlinear field versus voltage characteristics and wherein said monitor also includes memory means connected to receive an input from the output of said conversion means to provide from information stored in said memory means an output signal indicative of the strength of the field applied to said antenna.

6. The invention of claim 5 wherein said antenna probe includes three orthogonally mounted antennas and detectors connected to three conductor pairs and wherein the output signal from said memory is indicative of the square of the field strength sensed by said antenna and wherein adder means are provided for summing the detected field strength of the three antennas in said antenna probe to provide an output indication which is the sum of the squares of the three detected field components.

7. The invention of claim 6 wherein said detectors are Schottky diodes.

8. The invention of claim 6 wherein said detectors are thermocouples.

9. The invention of claim 6 wherein further means are provided for temporarily storing the largest sum of detected field strengths.

10. The invention of claim 9 wherein said further means comprises:

latching means for receiving the sum of detected field strengths;

comparator means for comparing the sum stored in said latching means and the sum at the adder output; and control means for replacing the sum in said latching means when the sum at said adder means output is larger than the sum stored in said latching means.

* * * * *